United States Patent [19]

Dugan

[11] 4,278,511
[45] Jul. 14, 1981

[54] PLUG PLATING

[75] Inventor: William P. Dugan, Pomona, Calif.

[73] Assignee: General Dynamics, Pomona Division, Pomona, Calif.

[21] Appl. No.: 125,805

[22] Filed: Feb. 28, 1980

[51] Int. Cl.³ .......................... C25D 5/02; C25D 7/04
[52] U.S. Cl. ........................ 204/15; 204/24; 204/38 B
[58] Field of Search ............... 204/15, 24, 26, 30, 204/35 R, 38 B, 38 S; 427/97

[56] References Cited

U.S. PATENT DOCUMENTS

| | | | |
|---|---|---|---|
| 2,699,425 | 1/1955 | Nieter | 204/18 |
| 2,872,391 | 2/1959 | Hauser | 204/15 |
| 3,143,484 | 8/1964 | Olin | 204/15 |
| 3,171,796 | 3/1965 | Stephens | 204/15 |
| 3,370,351 | 2/1968 | Freehauf | 29/625 |
| 3,566,005 | 2/1971 | Shaheen | 174/68.5 |
| 3,606,677 | 9/1971 | Ryan | 29/625 |
| 3,673,680 | 7/1972 | Tanaka | 29/626 |
| 3,855,692 | 12/1974 | Dugan | 29/625 |
| 3,969,815 | 7/1976 | Hacke | 29/625 |
| 4,104,111 | 8/1978 | Mack | 156/656 |

*Primary Examiner*—T. M. Tufariello
*Attorney, Agent, or Firm*—Henry M. Bissell; Edward B. Johnson

[57] ABSTRACT

Method for producing fine line circuit boards utilizing both sides thereof, with through-hole plating wherein the board is drilled and conductive metal clad, the surface is passivated and the holes and the surfaces are electroplated to a desired thickness. Thereafter the surface electroplate is peeled off the board, leaving the plating in the holes. Subsequently the board is masked in a desired pattern, etched to remove the cladding and form a circuit, and then the mask is removed and solder is applied to the plated holes.

17 Claims, 7 Drawing Figures

PLUG PLATING

BACKGROUND OF THE INVENTION

1. Field of the Invention

The present invention relates to the production of circuit boards having circuitry on both sides of the board and providing connections therebetween by the use of conductive metal-filled holes. More particularly, the present invention is directed to the production of very fine line circuits of this nature.

2. Description of the Prior Art

There is a definite need in the art for small size circuit boards due to the tendency of the industry to miniaturize as much as possible. However, this presents a significant problem in the production of the circuit boards since conventional masking and plating procedures are not amenable to the production of very fine or narrow conductors.

One method of overcoming this size limitation is to produce circuit boards with circuitry on both sides, and thus allow a single board to carry more components. In order to do this, it is necessary to provide continuity between the two surfaces of the particular board. Such continuity may be provided by the production of a board with plugs of conductive metal in holes manufactured in the board. U.S. Pat. No. 3,566,005 to Shaheen describes such a circuit board with plugs and welding contacts.

Additionally, Ryan in U.S. Pat. No. 3,606,677 discloses a system in which the base material is sensitized after being drilled to provide the connections, and then electroless plated. A mask is then applied and electroplating effected in the unmasked areas. The mask is then removed and the electroless plate flash etched. The resulting circuit, however, suffers from the normal disabilities of this type of circuit, in that the masking and plating processes do not allow for very fine line circuit production. Another very similar process is described in U.S. Pat. No. 4,104,111 of Mack. This system uses the early masking process, noted above, but adds multiple plating steps including solder plating. This process, like the Ryan process, does not allow for the plating of very small holes, and is further limited to systems where the surface plating is approximately the same thickness as the plating of the hole. Thus further disabilities exist when considering miniaturization, since the plating thicknesses are dependent on each other.

Further, Hauser et al in U.S. Pat. No. 2,872,391 discloses a basic concept utilizing a strippable film over a background. In the Hauser et al system, the strippable film is layered over a base that has been previously coated with foil and a resist. The strippable film is removable without disturbing the resist, and holes are drilled in areas not covered by the film. The hole walls are then coated with a conductive material such as metal or graphite, and the film stripped away. This system allows hole plating at this time because the resist has been exposed again. However, the system depends on multi-layered patterns and resists, and uses the standard system, noted above, once the strippable film has been removed.

The above processes along with others in the art have come to be known as subtractive and additive processes. The subtractive process is more commonly employed, and includes the above systems in which copper cladding is applied to the substrate prior to copper electroplating, followed by the application of the photoresist, exposure and etching.

In the additive process, for example as described in the Ryan U.S. Pat. (No. 3,606,677) above, the circuitry is applied over the unclad substrate and then plating is effected in the area defined by the portions of the substrate not covered by photoresist. The inherent problem of the additive process is the lack of adhesion between the substrate and the plating. It has been suggested that this plating can produce sufficient adhesive strength, equal to that produced by foil lamination, but this is not generally accepted by the industry or by the armed forces.

It can thus be seen that each of the above-described processes of manufacturing circuit boards has certain inherent advantages and disadvantages. As a result, a continuous effort is being made to achieve better high-density packaging of electronic components. This requires the achievement of a reduction in conductor line width and concurrently of the space between conductors while maintaining good adhesion between the substrate and the printed circuits thereon. It is this improvement that is attained by the present invention.

SUMMARY OF THE INVENTION

The present invention comprises an improved process for manufacturing of printed circuit boards having plated through-holes. This process provides the capability of further miniaturizing circuitry with the retention of adhesion of layers and the production of high quality products. The process of the present invention further allows for the production of plated through-holes of very small sizes, limited only by the art's capability of producing holes, and production of concentration gradients in the electroplating step. Thus the process of the present invention enables higher density packaging of electronic components and circuit paths. This is due to the fact that the line width of the conductors and the size of the holes can be reduced at the same time, and thus the space between the conductors and the number of conductors can be increased for a given size board.

In the process of the present invention, a conventional dielectric board such as an epoxy board is used. The board is drilled in the desired pattern, and then clad with conductive metal, for example by electroless plating, to provide continuity in conductivity throughout the whole of the board. The clad surface is then passivated, for example with chromic acid when utilizing a copper cladding. The passivated and clad board is then plated with the appropriate metal, especially copper, in an electroplating bath by conventional methods. The copper plating is continued until the desired wall thickness, after completion of the plating, is obtained. For example, 0.013 inch holes have been plated in a bath to a wall thickness of 0.005 in. It should be noted that the plating within the holes is limited to the art's capability to provide small holes, and by the concentration gradient produced by the plating. That is, during plating, when the hole size becomes quite small the copper ions available for plating in the hole would decrease, and thus plating would be slightly slower in the center of the hole. After removal from the plating bath and appropriate drying, etc., the copper plating is then peeled from the two opposite surfaces of the board. This is easily done by shearing off the edges of the board, and then peeling the copper plating. The peeling of the electroplated copper is facilitated by the fact that the cladding has been passivated, and the result is through-hole plating from copper clad surface to copper clad surface, as the shearing and peeling remove only the surface copper, and not the copper in the holes.

If desired at this point, after cleaning and sanding of the copper clad surfaces, replating can be effected to establish appropriate surface thicknesses. However, if proper copper cladding is effected, then this step is not necessary. The clad hole-plated board is then masked and the appropriate photoresist film laid over it by conventional methods, exposed, and dried. The dried masked board can then be etched by conventional methods, and after removal of the mask, the appropriate junctions and connections have been produced.

At this point it is preferable to solder coat the circuit, e.g. by dipping in a solder bath, and removing undesired solder by conventional methods so that the holes have a further layer or coating of solder for attachment of the appropriate electrical connections. Finally, solder re-flow should be effected to produce a smooth and even solder layer, and a completed circuit board.

BRIEF DESCRIPTION OF THE DRAWINGS

A better understanding of the present invention may be had from a consideration of the following detailed description, taken in conjunction with the accompanying drawings in which.

DESCRIPTION OF THE PREFERRED EMBODIMENTS

Figure 1:
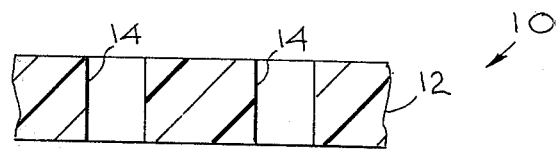
FIGS. 1–7 are a series of fragmentary sectional views corresponding to the successive process steps in the preparation of a printed circuit board having plated through-holes in accordance with the present invention.

Referring to FIG. 1, the circuit board, indicated generally by 10, is a conventional dielectric circuit board and can be any one of numerous resins such as epoxies and phenolics. Base sheet 12 is initially drilled with holes 14 at selected points, each of which defines a place where the plug plating is desired. The size of the hole is generally not limited by the process of the present invention, and thus can be any size desired. In particular, holes down to a diameter of 0.005 inch are contemplated. The preferred hole size, however, approximates about 0.013 inches.

Figure 2:
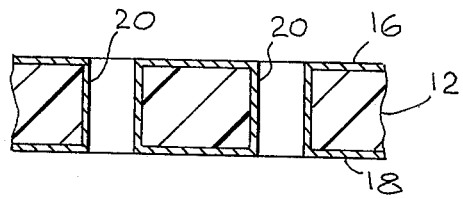

Referring to FIG. 2, board 12 having the dielectric characteristics noted above is electrolessly clad with a conductive metal such as copper, nickel, or other known continuity-providing metallic cladding. Other methods of deposition of this cladding may be utilized so long as they provide sufficient conductivity and continuity over the whole of the surface of the board, including the holes, to allow electroplating. Further, the thickness of the cladding will be determined by, in addition to continuity, such factors as the desired final circuit thickness, the expense and time for the electroless coating or other cladding method, and other considerations. In the cladding, the conductive metal is deposited on upper surface 16, lower surface 18, and along the inside 20 of the holes. Additionally, it should be noted that by the process of the present invention it is not necessary that this cladding be exactly the thickness desired for the final circuit, as, if desired, a subsequent electroplating step can be effected to adjust surface thickness and provide the appropriate circuit thickness.

After the cladding is effected, the surfaces of the board, 16 and 18, and hole surfaces 20 are passivated by standard procedures. Preferably chromic acid is utilized and chromates are formed on surfaces 16, 18 and 20 by dipping in an appropriate solution. However, it is also possible to use a metallic nickel-flash coating at high temperature and/or use vacuum deposition. This layer is not specifically shown, as the chromate formation could be very thin, if not monomolecular.

Figure 3:
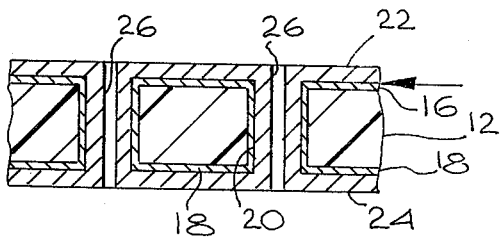

Copper, or other suitable conductive metal selected for the particular circuit used, is then deposited at upper surface 22, lower surface 24, and in plug area 26 as shown in FIG. 3. This plating is done by standard methods, for example by using a copper plating bath operated at a selected amperage, for a given period of time, depending upon the hole size, and the desired electroplated coating characteristics, including thickness. It should be noted that the only limiting factor in this step of the invention is the concentration gradient produced as the copper coating fills the hole. It is most desirable to plate the hole or plug to the point where the eventual solder coating and the re-flow thereof will produce a structure which will still allow for the insertion of wires in the holes. As a general rule, at least during the initial portion of the plating, the copper coating will be of equal thickness in all areas. However, as the hole is filled up, the amount of solution in the hole would decrease and thus the copper available for plating in the hole itself would decrease. The result is that a thicker coating would gradually be built up on exterior surfaces 22 and 24. In section, the hole surfaces are shown to be angular, but in practice the junction between surface 26 and surface 22 or 24 is relatively curved.

Figure 4:
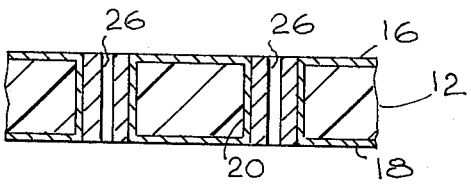

In the next step of the process of the present invention, the board produced in FIG. 3 is removed from the bath and dried, if desired, and coatings 22 and 24 mechanically removed. Stated simply, this means merely peeling the surface layer off, as the passivation step allows for the separation of cladding 16 and coating 22 at the point indicated by the arrow in FIG. 3. The same is accomplished to separate coating 24 from cladding 18 on the lower surface. It has been found that the simplest and quickest method of doing this involves shearing off all four edges of the board, assuming that a rectangular or square board is utilized, and then mechanically peeling plating layers 22 and 24. The resulting structure is shown in FIG. 4 wherein base 12 now has cladding layers 16 and 18 re-exposed, and has retained electroplated coating 26. The peeled board is next cleaned and sanded by the use of, for example, fine wet sandpaper and standard degreasers and cleaners such as acid cleaners and alkaline cleaners. The circuit is now ready for masking and etching.

As a result of the above steps the prior art limitations with regard to hole size and expense have been eliminated. That is, the present process is not limited to the particular thickness of the external surface coating in determining the hole size, and is not subject to the expenses of thick layer vacuum deposition procedures which have a tendency to selectively deposit on the surface and not in the holes. Due to the above procedure, the hole depth and size are not critical to the board, as they do not control the thickness of the electroplated coating on the board surface. As a further advantage, the stripped or peeled copper layer is reusable, and thus there is a minimization of waste by the process of the present invention. If the copper cladding in the first step of the present invention is not thick enough, or it is desired to copper clad very thinly in this step, then at this point in the process, i.e. prior to masking, a very thin replating may be effected. This replating, not shown, would be primarily utilized to obtain proper conductive metal thickness on outer surfaces 16 and 18.

Figure 5:
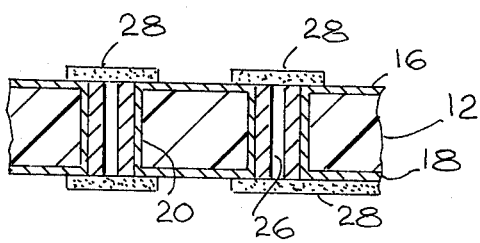

As shown in FIG. 5, after appropriate cleaning and plating if desired, a mask in the form of the desired circuit is provided. The mask is preferably of the dry film type which is coated on both sides of the circuit and then exposed to polymerize the mask in accordance with the circuit to be produced. The dry film process is preferred since it coats or tents the holes in the center of the plugs, and this coating is needed to ensure that the etching of the plated surface does not etch the plugs. The photoresist coating may be as thin as 0.001 inches, so long at it exhibits sufficient body for effective etching.

A chemical etchant, not shown, would then be applied to both surfaces of the board, and would etch the exposed portions of copper surfaces 16 and 18. Typical etchants would include ferric chloride and ammonium persulfate and the etching step would be carried out, for example, for a period of about 15 to 20 minutes. The time required, of course, would depend on the concentration of the etchant solution and the thickness of the exposed portions of copper layers 16 and 18 as well as whether or not an additional surface coat of copper has been applied by subsequent electroplating.

Figure 6:
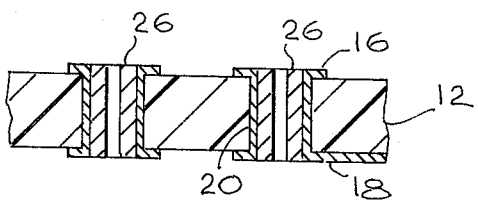
Figure 7:
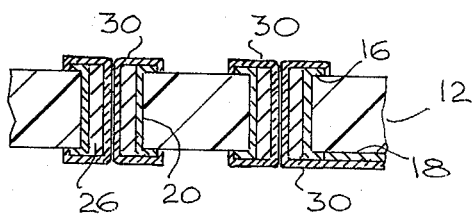

After rinsing and washing by conventional methods to remove the etching solution, and to dissolve mask 28, the resulting circuit is as shown in FIG. 6. The circuit board base 12 is now exposed to separate the fine line portions of the circuitry, and copper cladding 16 and 18 remains to produce the desired circuitry, with through-hole or plug plating being provided by copper cladding 20 and electrodeposited copper 26. The resulting structure is now ready for the last step of the process prior to the insertion of the appropriate electronic components. That is, the board is dipped in a solder bath, and excess solder blown off or centrifugally thrown off, by conventional methods. The solder coating primarily remains on the conductive surfaces on the board. In particular, as shown in FIG. 7, board 12 having previously discussed circuitry 16, 18, 20 and 26 is provided with a typical tin/lead solder coat 30 for easy attachment of electrical components. It is preferred, but not absolutely necessary, that the board be reheated at this point and the solder re-flowed in order to assure smooth, even and complete solder coverage at the appropriate points.

Although there have been described above particular methods of making circuitry with plated through-holes in accordance with the invention for the purpose of illustrating the manner in which the invention may be used to advantage, it will be appreciated that the invention is not limited thereto. Accordingly any and all modifications, variations or equivalent arrangements which may occur to those skilled in the art, such as the utilization of different metals in the plating steps and the optional metal plating step, should be considered to be within the scope of the invention as defined in the appended claims.

What is claimed is:

1. A method of hole plating comprising:
   providing a dielectric substrate having two opposite side surfaces;
   providing selected holes in said substrate between the surfaces;
   conductively coating the substrate and hole surfaces;
   plating the conductive surfaces; and
   removing the plating from the conductive substrate surfaces without removing the plating from the holes.

2. The method of claim 1 further comprising applying a photoresist pattern to the substrate after removal of the plating, developing the photoresist, etching the conductive coating in accordance with the photoresist pattern, and removing the photoresist.

3. The method of claim 2 further comprising solder coating the plated holes after removal of the photoresist.

4. The method of claim 3 further comprising reflowing said solder coating after it solidifies.

5. The method of claim 2 further comprising electroplating the substrate and plated holes before application of the photoresist.

6. The method of claim 1 further comprising passivating said conductive coating, before plating.

7. A method for producing printed circuit boards comprising:
   forming holes in a dielectric base at selected points;
   cladding the base with a conductive coating of metal;
   conductive metal plating said clad base;
   peeling the plating off of the surfaces of the clad base, leaving said plating in said holes;
   masking said base to define a circuit;
   etching the unmasked surfaces of said base to remove said cladding; and
   removing said mask and solder coating said circuit.

8. The method of claim 7 wherein said plating is copper.

9. The method of claim 7 wherein said cladding is passivated before electroplating.

10. The method of claim 9 wherein said cladding is copper.

11. The method of claim 10 wherein said passivation is effected by chromic acid.

12. The method of claim 7 wherein the edges of said board are removed before said peeling step.

13. The method of claim 7 wherein said peeled surface is cleaned before said mask is applied.

14. The method of claim 13 wherein an additional electroplating step is effected after said peeling step.

15. The method of claim 7 wherein solder is reflowed after the initial coating thereof.

16. The method of claim 7 wherein said cladding is effected by electroless deposition.

17. A method of producing circuit boards comprising:
   selecting a dielectric base;
   drilling selected holes in said base corresponding to a circuit pattern;
   electroless depositing copper on said base and in the holes;
   passivating the surface of the base;
   copper electroplating the passivated base and holes to a thickness which produces a conductive coating in said holes;
   shearing off the edges of the base;
   peeling the electroplated copper off of both sides of the base to expose the copper in the holes;
   cleaning and degreasing the peeled base;
   masking the base on both sides to define a circuit;
   applying and developing a photoresist corresponding to said mask;
   etching the electroless copper exposed by the photoresist;
   removing the photoresist; and
   solder coating the circuit.

* * * * *